(12) United States Patent
Gradinariu

(10) Patent No.: US 6,378,008 B1
(45) Date of Patent: Apr. 23, 2002

(54) OUTPUT DATA PATH SCHEME IN A MEMORY DEVICE

(75) Inventor: Iulian C. Gradinariu, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/200,219

(22) Filed: Nov. 25, 1998

(51) Int. Cl.[7] .......................... G06F 3/00; G06F 13/00; G06F 13/14; G06F 13/28
(52) U.S. Cl. .................. 710/7; 710/5; 710/20; 710/31
(58) Field of Search ............... 710/4, 5, 33, 7, 710/20, 31; 365/230.01, 230.06; 327/51

(56) References Cited

U.S. PATENT DOCUMENTS

| | | | |
|---|---|---|---|
| 5,019,962 A | * 5/1991 | Funabashi et al. | 709/212 |
| 5,222,227 A | * 6/1993 | Funabashi et al. | 709/212 |
| 5,729,764 A | * 3/1998 | Sato | 710/52 |
| 5,734,604 A | * 3/1998 | Akamatsu et al. | 365/156 |
| 5,809,257 A | * 9/1998 | Shibazaki | 710/107 |
| 5,881,065 A | * 3/1999 | Abiru | 370/413 |
| 5,987,627 A | * 11/1999 | Rawlings, III | 714/48 |
| 6,038,626 A | * 3/2000 | Meaney et al. | 710/104 |
| 6,058,067 A | * 5/2000 | Satani et al. | 365/230.06 |
| 6,072,714 A | * 6/2000 | Deguchi | 365/154 |

OTHER PUBLICATIONS

Betty Prince, "Basic Memory Architecture and Cell Structure", Chapter 5 from Semiconductor Memories, A handbook of Design, Manufacture, and Application, Second Edition, Copyright 1983, pp. 149–206.

* cited by examiner

Primary Examiner—Thomas Lee
Assistant Examiner—Chun Cao

(57) ABSTRACT

An output data path scheme including a feedforward portion may be configured to drive a data signal from a selected local bus line onto a global bus and a feedback portion may be configured to drive the data signal from the global bus onto a deselected local bus line. A first sense amplifier may be configured to drive the data signal onto the selected local bus line. A second sense amplifier may be coupled to the deselected local bus line and may be configured to tristate.

18 Claims, 7 Drawing Sheets

OUTPUT DATA PATH SCHEME IN A MEMORY DEVICE

FIELD OF THE INVENTION

This invention relates to circuitry used in an output data path of an integrated circuit and, in one particular example, to a scheme for an output data path suitable for use in a memory device.

BACKGROUND

Memory circuits are commonly organized into an array of memory cells arranged in rows and columns. FIG. 1 illustrates the general organization of such memory circuits in which row addresses are used to select word lines and column address are used to select bit line pairs to access the correct cell in a memory array. The memory array is connected to sense amplifiers via the bit lines. The sense amplifiers are designed to sense the logic state of a selected memory cell and provide an amplified signal, representing cell data, to output drivers via the local bus lines. The output drivers are then connected to a global bus. These output drivers are designed to enhance the amplitude of the sense amplifier output signal; to level shift the sense amplifier output signal in order to interface with a different voltage level; and to drive global bus loads.

A control circuit is used to activate the path on which data from a particular cell is read out. The sense amplifier connected to the desired cell is selected and the corresponding bit lines carry the cell data to the selected sense amplifier where the logic state of the cell is detected and read onto the local bus. At the same time, the output driver corresponding to the selected sense amplifier is activated causing the logic state on the local bus to be passed on to the global bus. Based on the signal received from the sense amplifier, the output driver either outputs a logic high or a logic low. However, when a sense amplifier is deselected (i.e., not originally selected or deselected because a different sense amplifier is selected corresponding to a different cell location) then the output driver corresponding to the deselected sense amplifier tristates so that its connection to the global bus does not affect the signal of the selected output.

One type of memory circuit uses complementary outputs from the memory array and, thus, complementary bit lines are available as inputs to the sense amplifiers. A differential sense amplifier is used to sense the difference in signal levels on the complementary bit lines in order to determine the logic state of a memory cell. The logic state is then provided to the global bus on a differential output data path through an output driver.

The memory circuit illustrated in FIG. 1 uses a differential signal on a bit line pair 10 to provide the sensed state of a memory cell to the output driver. Use of a differential signal provides better noise immunity which is advantageous in fast memory circuits were a greater amount of noise is generated due to faster switching. Furthermore, a differential signal allows for encoding four states: logic high, logic low, and two high impedance states. As such, if both bit lines are high (11) or both lines are low (00) then the output driver can be signaled to tristate. At the beginning of a read cycle, the output driver is tristated by taking the line pair corresponding to each bit (initially 01 or 10) to an intermediate logic state (00 or 11). Data is then switched between logic levels during this intermediate period when the output driver is tristated so that any glitch caused by this operation is thereby ignored. The new data, when available, is transitioned on one line only to the opposite state in order to enable the output driver. A complete read cycle, however, takes two global data line transitions.

One problem with such a system is that two bit lines are needed to carry the differential signal. This requires more space than a single bit line and, thus, increases the size of the memory circuit. Another problem is that because of two global data transitions per cycle, the current consumption is increased due to additional line capacitance switching.

Another memory circuit, illustrated in FIG. 2, uses only a single bit line 210 to provide the cell state from the sense amplifier to the output driver. A single bit line, however, can only encode two states: logic high and logic low. Thus, tristate information cannot be carried on a single bit line. Although this arrangement is more space efficient, it makes sensing the cell state more difficult since a differential input signal is not available. In such a memory circuit, a separate line 220 is used to tristate the output driver when the data on the bit line is switched between logic states.

One problem with using a separate tristate line is that it can create a race condition. A race condition occurs when, due to different skews on the bit line and tristate line paths, data on the bit line switches logic states before or after the output driver is signaled to tristate. This condition results in a failure to properly read a memory array cell.

One solution these problems is to increase the amount of time the output driver is tristated in order to increase the chance that the bit line switches logic states within the tristate window. Although the use of a longer tristate window may decrease the chance of a race condition, it slows down the speed of the memory circuit. For example, if the data on the bit line switches immediately after the start of the tristate window, then from that point in time to the end of the window the output driver remains idle.

Yet another problem with such systems is glitching that occurs on the global bus during memory cell address switching. The global bus has a large capacitance due to its extensive length. In order to reduce the need for a large current to drive this large capacitance, the local bus (running parallel to the memory array and collecting data from the sense amplifiers) is partitioned into smaller sections referred to as local bus lines. Data on the local bus lines is then multiplexed onto the global bus line. When selecting a memory cell in a memory array location different from a previously selected cell (with a different corresponding local bus), the global bus may momentarily change states depending on the states currently residing on the local buses. This glitch condition occurs when changing between two local buses corresponding to different memory array locations where the two local bus lines initially possess different logic states and then possess the same logic state when new data is accessed from the memory array.

The following example illustrates a glitch that may occur on the global bus when switching between local bus lines. For this example, assume the global bus was previously carrying a logic 0 and the newly selected data to be placed on the global bus is also a logic 0. The local bus line B0 that was previously active carried a logic 0 and the newly selected local bus line B1 (corresponding to the newly selected data cell) was previously carrying a logic 1. As the new data becomes available (i.e., as the sense amplifier corresponding to B1 becomes active) the output circuit of B1 outputs its data as it is changing states from a logic 1 to a logic 0. Thus, instead of keeping the data on the global bus constant at a logic 0, the global bus is momentarily switched to a logic 1 (the previous state of the B1 output driver as it becomes active) before it receives the newly selected logic 0 data.

As a result of these glitches, current consumption is increased because the memory circuit is forced to charge and discharge the capacitance of the global line due to its momentary change in state. Furthermore, data access time is increased to allow time for the glitches to dissipate.

One solution to the problem is to increase the amount of time the output circuit is tristated in order to decrease the chance that a glitch appears on the global bus. As discussed above, the use of a longer tristate window is not desirable because it may slow down the overall speed of the memory circuit.

Accordingly, it is desirable to have a circuit that allows for use of a single ended output data path while addressing bus glitching and race conditions without significantly reducing access times.

SUMMARY OF THE INVENTION

The present invention provides an output data path including a feedforward portion that may be configured to drive a data signal from a selected local bus line onto a global bus and a feedback portion that may be configured to drive the data signal from the global bus onto a deselected local bus line. A first sense amplifier may be configured to drive the data signal onto the selected local bus line. A second sense amplifier may be coupled to the deselected local bus line and may be configured to tristate.

In one embodiment, an output circuit is provided that includes a first driver having a data input coupled to receive a first data, a control input coupled to receive a block control signal, and an output. A second driver, which may be included in the output circuit, may have a data input coupled to receive a global bus data, an inverted control input coupled to receive the block control signal, and an output. The output of the second driver may be coupled to the data input of the first driver, the data input of the second driver may be coupled to the output of the first driver, and the control input of the first driver may be coupled to the inverted control input of the second driver.

In another embodiment, the second driver may tristate and the first driver may be active if the block control signal is a first value, and the first driver may tristate and second driver may be active if the block control signal is a second value.

In yet another embodiment, the output circuit also includes a first local bus line having the first data, a second local bus line having a second data, and a global bus having the global bus data. A third driver which may also be included in the output circuit may have a data input coupled to receive the second data, a control input coupled to receive the block control signal, and an output. A fourth driver which may also be included in the output circuit may have a data input coupled to receive the global bus data, an inverted control input coupled to receive the block control signal, and an output. The output of the fourth driver may be coupled to the data input of the third driver. The data input of the fourth driver may be coupled to the output of the third driver. The control input of the third driver may be coupled to the inverted control input of the fourth driver.

In another embodiment, the second and the third drivers may tristate, the first driver may output the first data onto the global bus line, and the fourth driver may output the global bus data onto the second local bus line if the block control signal is a first value. The first and the fourth drivers may tristate, the third driver may output the second data onto the global bus line, and the second driver may output the global bus data onto the first local bus line if the block control signal is a second value.

Additional features and advantages of the present invention will be apparent from the accompanying drawings and from the detailed description that follows.

BRIEF DESCRIPTION OF THE DRAWINGS

The present invention is illustrated by way of example, and not by way of limitation, in the figures of the accompanying drawings in which like reference numerals refer to similar elements and in which.

DETAILED DESCRIPTION

An output data path is described including a feedforward portion may be configured to drive a data signal from a selected local bus line onto a global bus and a feedback portion may be configured to drive the data signal from the global bus onto a deselected local bus line. A first sense amplifier may be configured to drive the data signal onto the selected local bus line. A second sense amplifier may be coupled to the deselected local bus line and may be configured to tristate.

In the following description, numerous specific details are set forth such as examples of specific voltages, components, circuits, processes, etc. in order to provide a thorough understanding of the present invention. It should be appreciated, however, that these specific details need not be employed to practice the present invention. In other instances, well known structures and circuits have not been described in detail in order to avoid unnecessarily obscuring the present invention.

An output scheme which is one example of the present invention is described in conjunction with a memory circuit. The present invention may be used with various types of memories, for example: SRAM, DRAM, EPROM, and flash memories. It should be noted, however, that the output scheme is not limited to use with only memory circuits but may also be used in other types of circuits that require signals to be multiplexed between different local and global buses, for example a digital signal processor (DSP) circuit.

Figure 1:
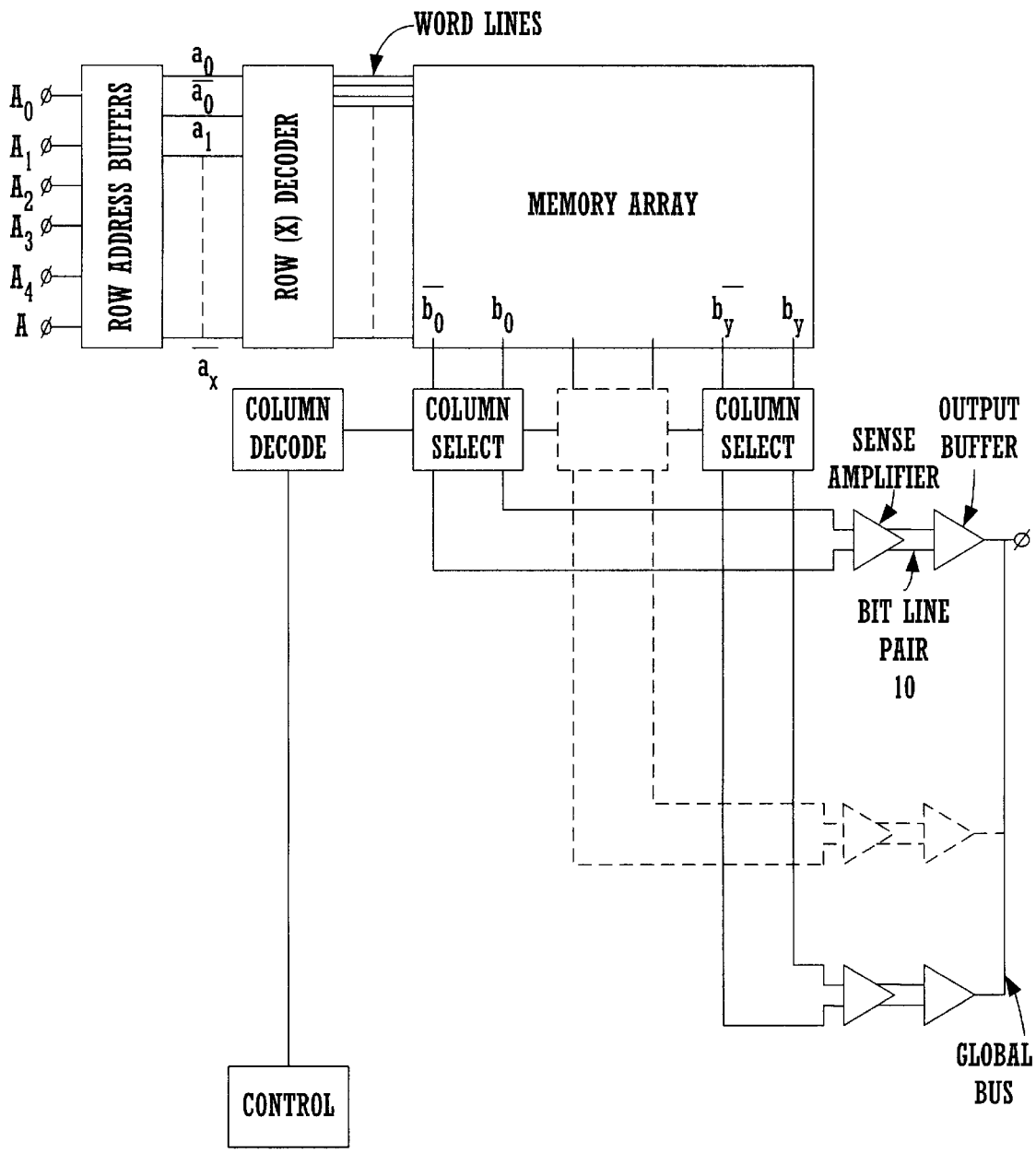
FIG. 1 illustrates a memory circuit that uses a differential signal to provide the sensed state of a memory cell to an output driver.
Figure 2:
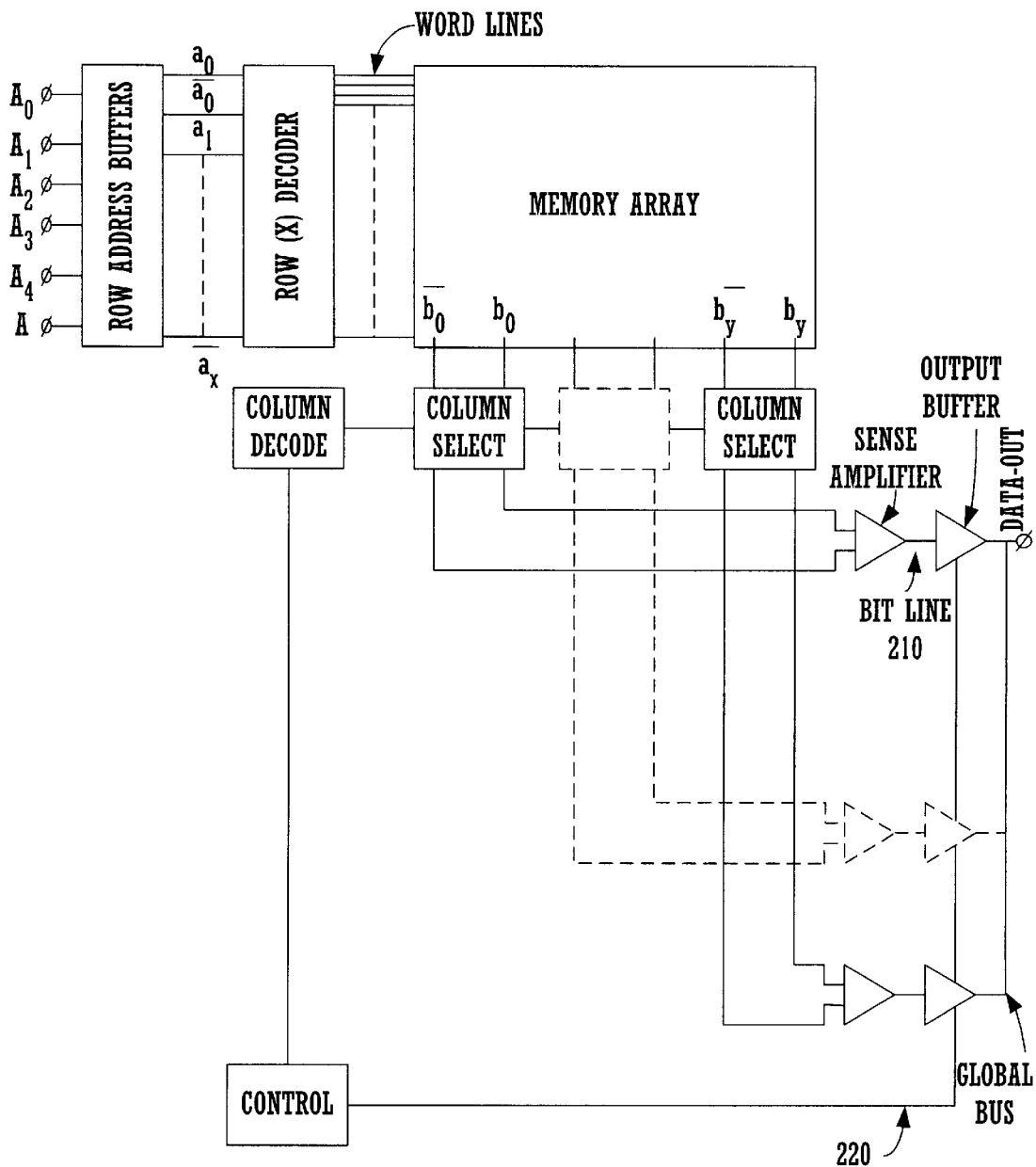
FIG. 2 illustrates a memory circuit that uses a single bit line to provide the sensed state of a memory cell to an output driver.
Figure 3:
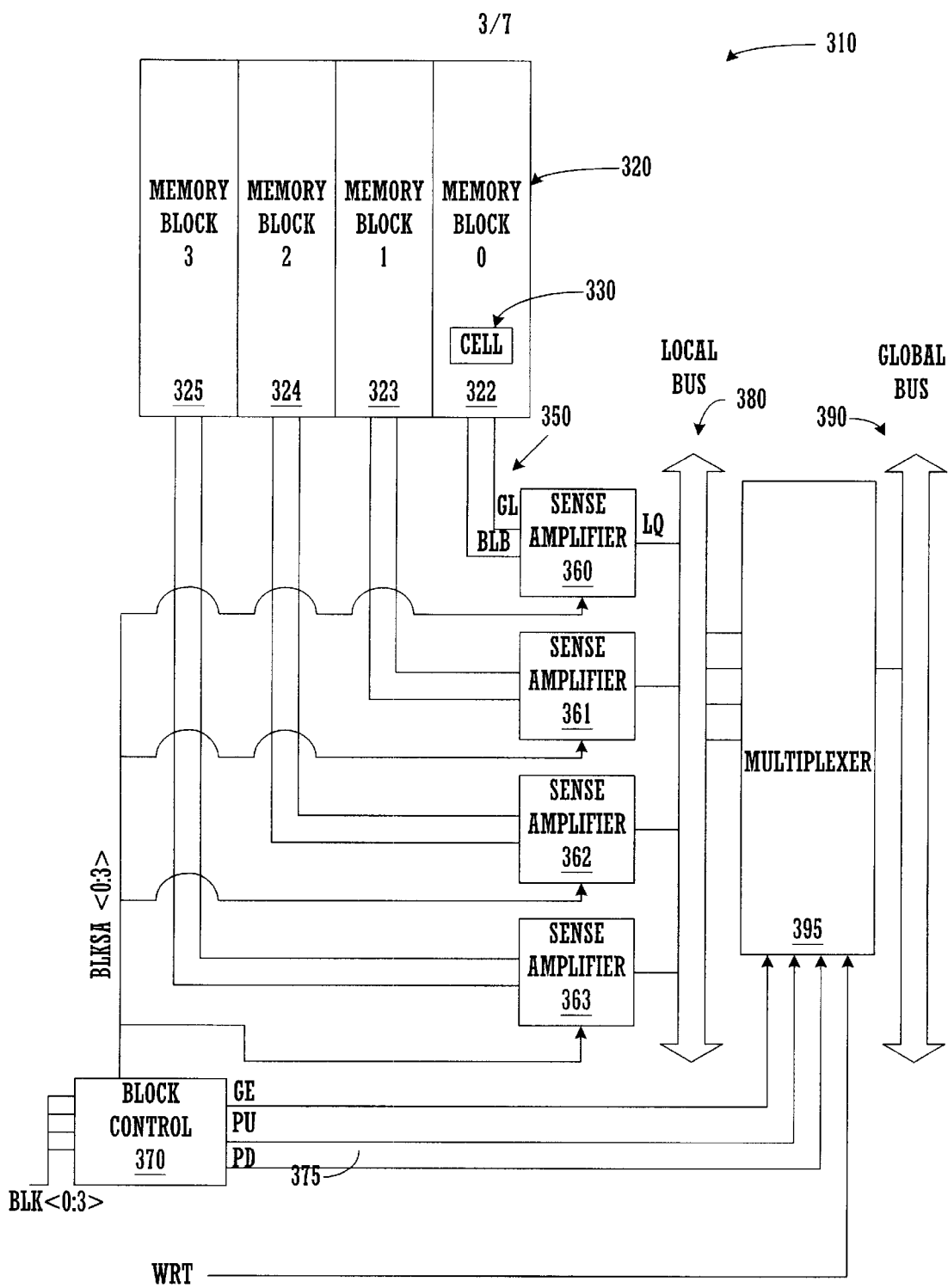
FIG. 3 illustrates a block diagram of a memory circuit that contains an output circuit configured in accordance with one embodiment of the present invention.

FIG. 3 illustrates a block diagram of a memory circuit 310 that contains an output circuit configured in accordance with one embodiment of the present invention. It should be noted that this illustration is only one example of the memory circuit configuration that may be used in connection with the present output circuit. Other configurations for the memory circuit. that are well known in the art, may also be used.

Memory circuit 310 includes a memory array 320, sense amplifiers 360–363, block control circuitry 370, block control bus 375, local bus 380, global bus 390, and multiplexer 395. The memory array 320 may be partitioned into a plurality of memory blocks 322–325. While four memory blocks are shown in FIG. 3, memory array 320 may be partitioned into any number of memory blocks. Each of the memory blocks 322–325 of memory array 320 contains a plurality of cells, with a cell 330 capable of being programmed with a particular binary state representing a bit of stored data. For one embodiment, memory array 320 is made of SRAM cells (e.g., conventional six transistor SRAM cells as are well known in the art). As noted above, in other embodiments memory array 320 may be made up of other memory cells, for example: non-volatile SRAM, DRAM, EPROM or flash memory cells.

For the illustrated embodiment, data from a selected cell of memory array 320 is directed along a bit line pair 350 to the sense amplifier corresponding to the memory block in which the selected cell is located. In other embodiments, a single bit line may be used where the input to the sense amplifier is a difference signal representing the state of the cell being sensed as compared to a predetermined reference state. Configurations for addressing the cells and reading and writing data from/to the cells are generally known in the art and, hence, need not be described herein.

Referring still to FIG. 3, data read by the sense amplifiers 360–363 is transmitted to multiplexer 395 via local bus 390. Sense amplifiers 360–363 are designed to sense the logic state of a selected memory cell and provide an amplified signal, representing the cell data, to multiplexer 395. Multiplexer 395 drives a global bus 390 which carries the cell data out of the memory circuit (e.g., to output pads that may be coupled to pins of an integrated circuit).

Figure 4:
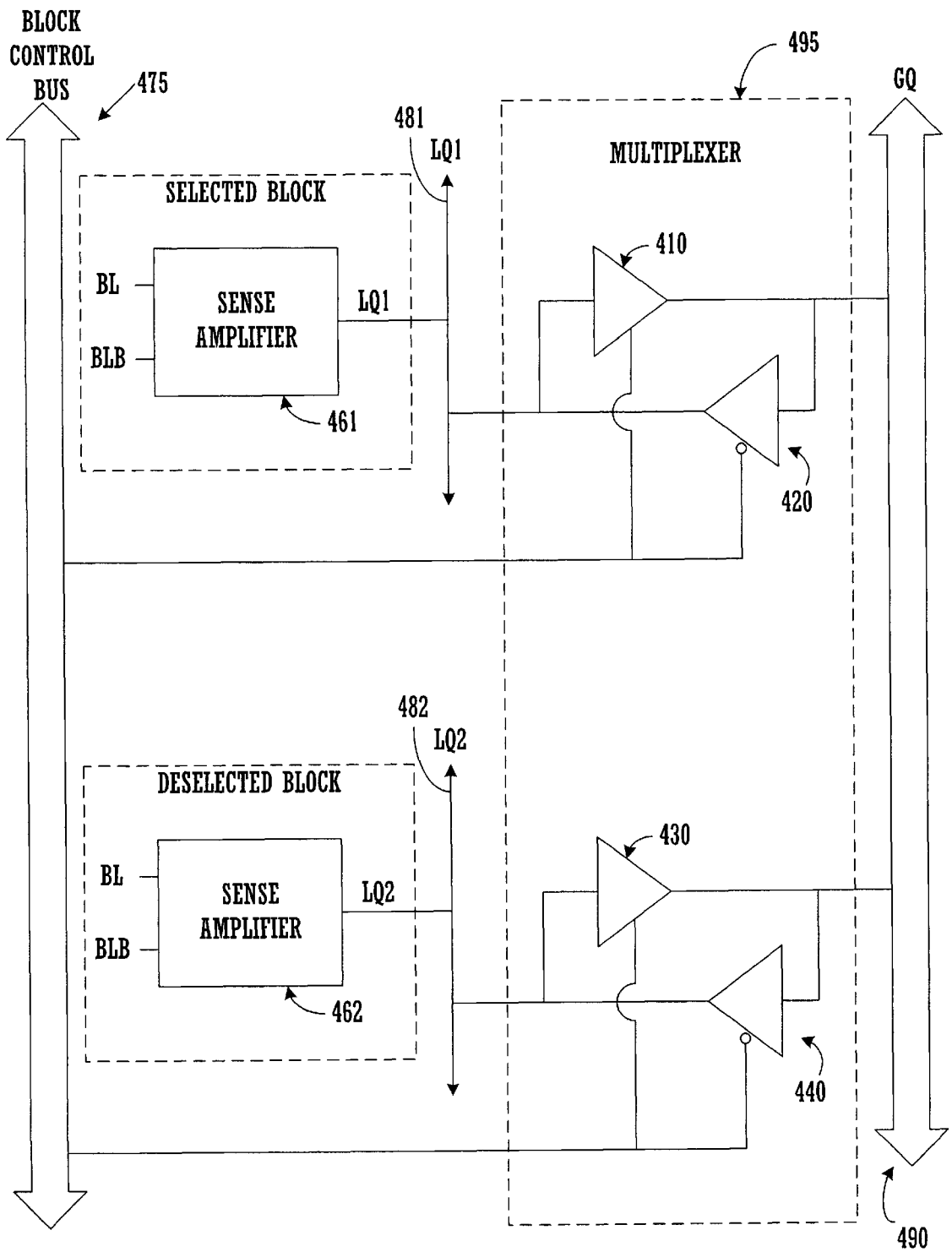
FIG. 4 illustrates an output scheme as may be used according to one embodiment of the present invention where signals are multiplexed between a local and global bus.

FIG. 4 illustrates an output where signals are multiplexed between the local bus lines 481, 482 and the global bus 490, in further detail. Data (of a selected memory block cell) on a local bus line (LQ1) 481 (received from its corresponding sense amplifier 461) is transmitted to the global bus 490 by activating output driver 410 and tristating feedback driver 420 coupled between local bus line 481 and global bus 490. In addition, a local bus line (LQ2) 482 corresponding to a sense amplifier 462 of a deselected memory block is forced to follow global bus 490 by tristating output driver 430 and activating feedback driver 440 coupled between local bus line 482 and global bus 490. When a driver is tristated, its output is isolated in a high impedance state and, thus, does not affect the logic state of the bus to which it is coupled. By forcing the deselected local bus to follow the global bus when selecting data in a different memory block, any glitching that would have occurred on the local bus is prevented from affecting the global bus.

The following example illustrates how glitching is prevented. For this example, assume the global bus was previously carrying a logic 0 and the newly selected data to be placed on the global bus is also a logic 0. The local bus line that was previously active carried a logic 0 and the newly selected local bus line was previously carrying a logic 1. With prior art systems using only an output driver, the output driver of a selected block may transmit its previous logic high state as it is changing to a logic low if it is activated too early; thereby momentarily switching the global bus to a logic 1. The present output scheme, however, prevents this glitch by using feedback driver 420 of FIG. 4 to maintain local bus line 482 at the state of global bus line 490 before the block is selected and, thereby, prevents the transmission of any transients (i.e., glitches) onto global bus 490. Furthermore, the chance of a race condition is reduced even though the tristate timing window has not been increased.

Figure 5:
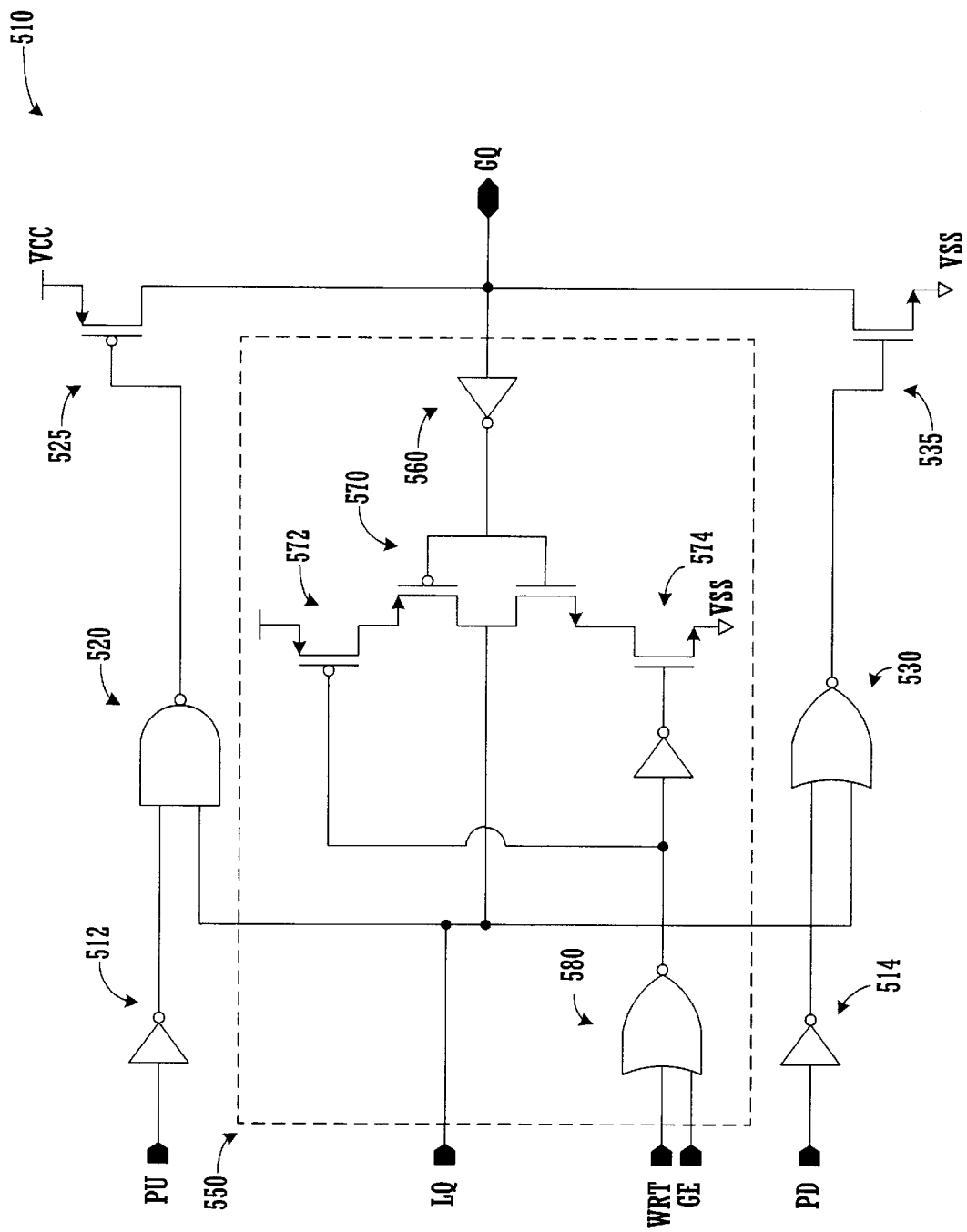
FIG. 5 illustrates one embodiment of an output and feedback driver used in a multiplexer according to the teachings provided herein.
Figure 6:
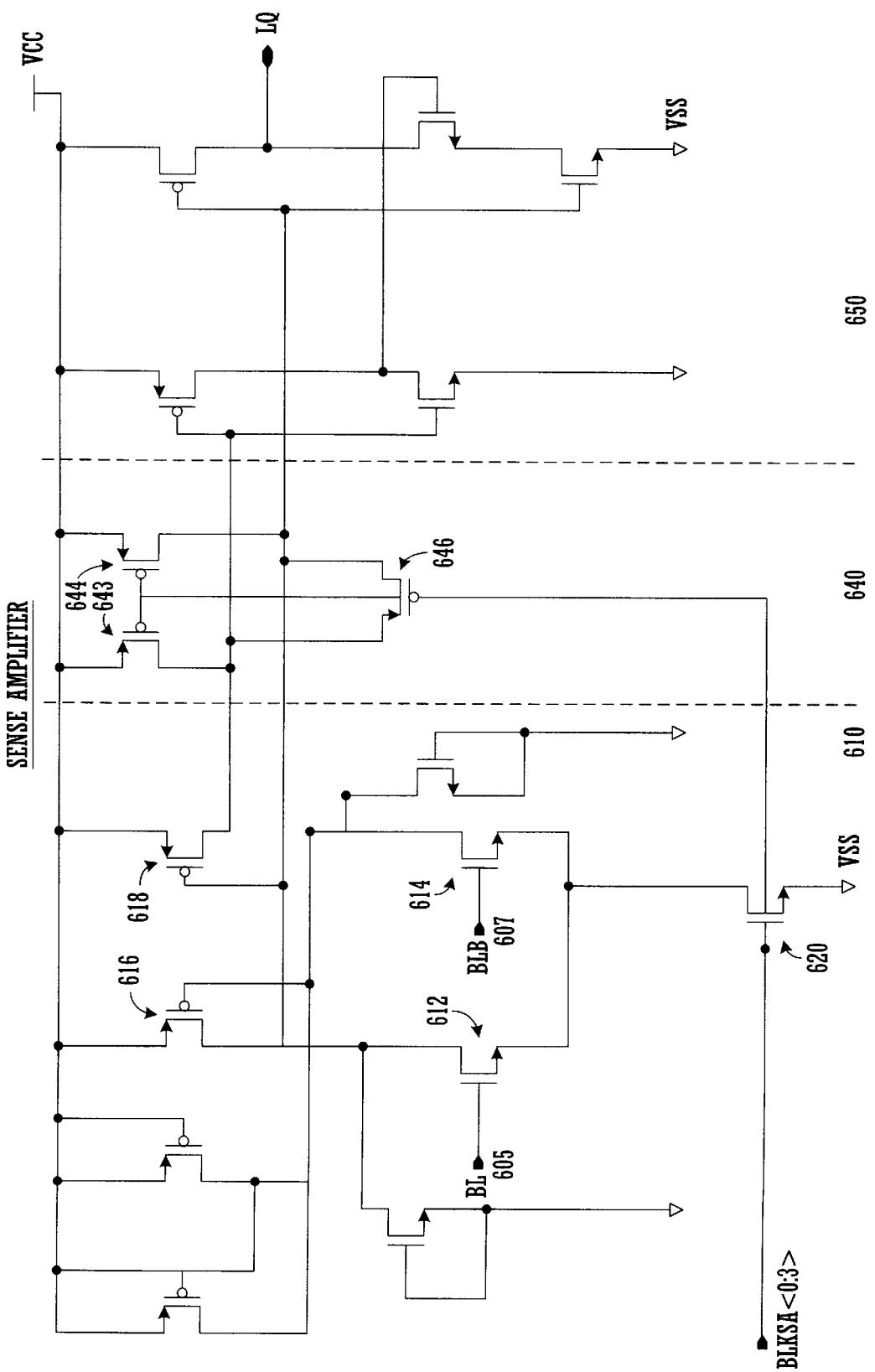
FIG. 6 illustrates one embodiment of a sense amplifier.
Figure 7:
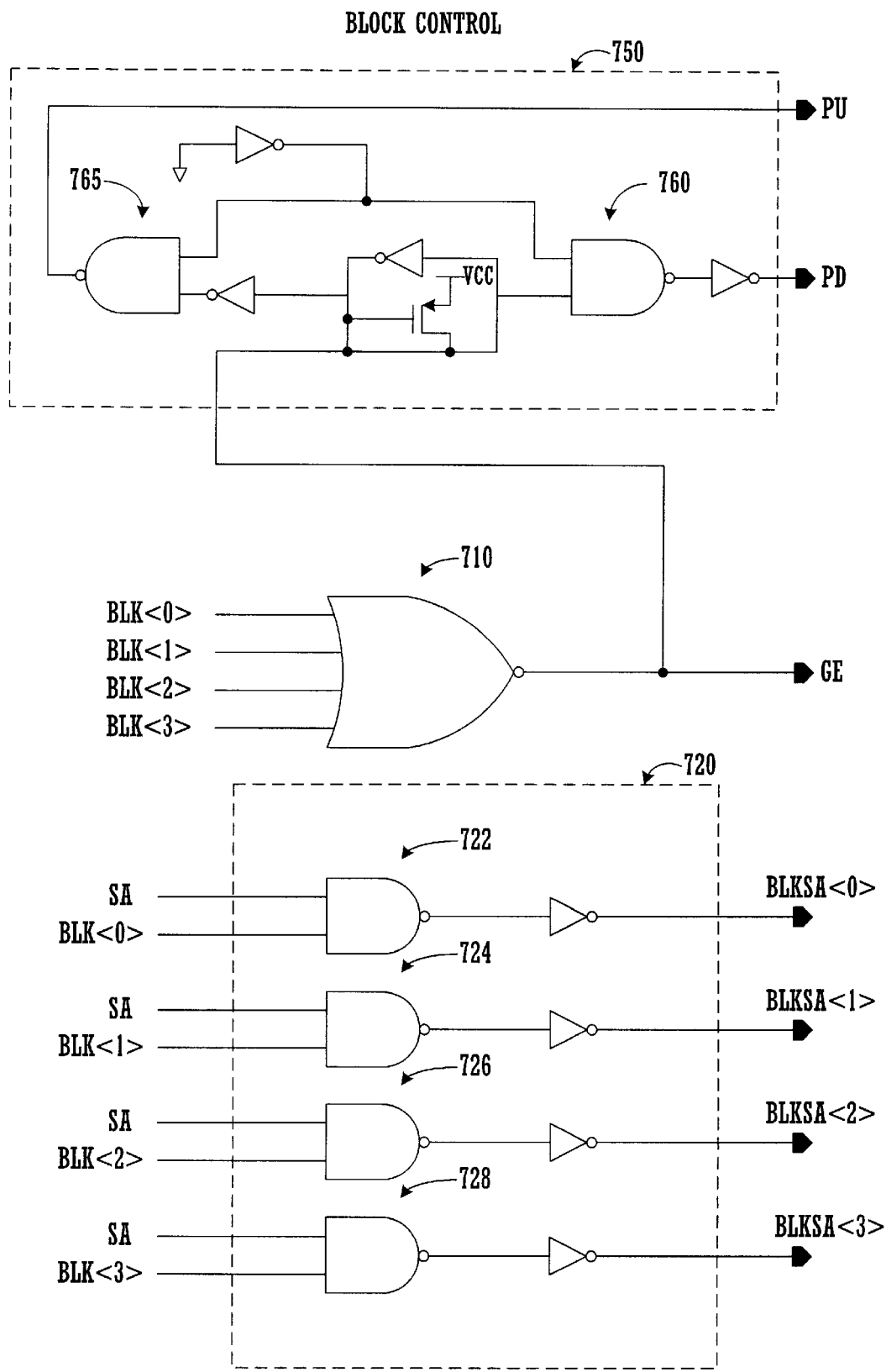
FIG. 7 illustrates one embodiment of a block control circuit.

The circuits described with reference to FIGS. 5–7 are illustrated using CMOS components. It should be noted, however, that these circuits may also be designed using Bipolar, NMOS, PMOS, or BiCMOS components as is well known in the art. Furthermore, the drivers may be designed to be full-swing CMOS, half-swing CMOS, ECL, or TTL standard compatible. The voltage supplies VCC and VSS utilized by these circuits correspond approximately to the range of 1.8 to 3.7 volts and 0 volts (ground), respectively. However, the circuits described below may be designed utilizing other voltages.

FIG. 5 illustrates one output/feedback driver pair of the multiplexer 395 in greater detail. Output driver 510 corresponds to output drivers 410 and 430 of FIG. 4. Feedback driver 550 corresponds to feedback drivers 420 and 440 of FIG. 4. Input LQ is received from local bus 380 of FIG. 3 and inputs PU (pull up), PD (pull down), and GE (group enable) are received via block control bus 475 of FIG. 4. The WRT (write) input corresponds to signal WRT of FIG. 3. The WRT input is used to enable all the feedback drivers in the multiplexer during a write cycle when data is written into the memory array 320 of FIG. 3. This is accomplished by transmitting a logic high on the WRT input to NOR gate 580.

When data from a memory block corresponding to output driver 510 is selected, block control 370 of FIG. 3 activates output driver 510 to transmit the data from the local bus (LQ) to the global bus (GQ). Output driver 510 is activated by transmitting a logic low on inverted input PU 512 and a logic high on inverted input PD 514. The inverted signals are applied to the inputs of NAND gate 520 and NOR gate 530, respectively. The output of these gates activate transistors 525 or 535 (depending on the polarity of LQ) such that GQ is driven high or low based on the LQ signal. The feedback driver 550 is tristated by maintaining the WRT input at a logic low and transmitting a logic low (from block control 370 of FIG. 3) on the GE input to NOR gate 580 signal. The output of NOR gate 580 acts to cut-off transistors 572 and 574, thereby tristating the output of feedback driver 550.

When the memory block corresponding to output driver 510 is deselected (e.g., when data is being read from a different memory block), block control 370 of FIG. 3 tristates output driver 510 and activates feedback driver 520. Block control 370 of FIG. 3 tristates output driver 510 by transmitting a logic high on the GE input to NOR gate 580, a logic high on inverted input PU 512, and logic low on inverted input PD 514. In another embodiment, block control 370 of FIG. 3 transmits one signal to multiplexer 495 of FIG. 4. This signal is applied to inputs GE, PU and PD (with PD having another series inverter). The inverted signals are applied to NAND gate 520 and NOR gate 530, respectively. The output signal from these gates turn off transistors 525 and 535, thereby tristating output GQ.

Feedback driver 550 is activated using two inverters 560 and 570 coupled in series between GQ and LQ. When transistors 572 and 574 turn on inverter 570, data residing on GQ is forced on LQ with the same polarity. The configuration of the output driver 510 is different from feedback driver 550 because output driver 510 is required to drive a large capacitance of the global bus 490 of FIG. 4 that spans the entire memory circuit. The feedback driver 550, however, is required to drive a smaller capacitance associated with the shorter local bus lines (i.e., 481 or 482 of FIG. 4). Furthermore, a faster driver is required in the direct data path so that the global bus is driven as quickly as possible. However, in the feedback path, driver speed is less significant since all that is required is that the local bus line and the global bus be equalized at the end of a read cycle.

FIG. 6 illustrates one embodiment of sense amplifiers 360–363 in greater detail. It should be noted, however, that other configurations for the sense amplifier may be used as is well known in the art.

The sense amplifiers include an input stage 610, a pre-set circuit 640, and an output stage 650. The input stage 610 is designed to receive a differential signal on inputs BL (bit line) and BLB (bit line bar). In memory circuits that use a single bit line to carry cell data from the memory array, the sense amplifier can be designed with a single ended input. The single ended input would be compared to a predetermined reference in order to detect the state of the cell.

Input stage 610 comprises transistors 612 and 614 and a cross-coupled load pair 616 and 618. Transistor 620 is used to enable the sense amplifier based on the BLKSA <0:3> (block sense amplifier) input from block control 370 of FIG. 3. For one embodiment, a logic 1 on BLKSA <0:3> enables the sense amplifier and a logic 0 tristates the sense amplifier such that output LQ has a high impedance. The remaining transistors in input stage 620 are insulation gates for matching purposes and are not active.

Pre-set circuit 640 is comprised of three equalization transistors 642, 644, 646 that pre-set the nodes of the sense amplifier to VCC when sense amplifier is not enabled. This allows the internal nodes of sense amplifier to be set to a known state to avoid slowing down the sense amplifier.

The output stage 650 transistors transform the differential signal from input stage 610 to a single ended output LQ which is transmitted to an output driver on a local bus line. Other sense amplifier configurations may be used in accordance with the present invention. For example, in one embodiment, a differential output stage is used in the sense amplifier to provide a differential signal to the output drivers.

FIG. 7 illustrates one embodiment of the block control circuitry 370 in greater detail. The block control circuitry generally includes a logic gate 710, a logic driver 750, and sense amplifier enable logic 720. The logic gate is a four input NOR gate 710 wherein one of the inputs is active at a given time. The four inputs BLK <0:3> correspond to the four memory blocks (0:3) 322–325 of FIG. 3. When all four inputs are 0 (logic low), output GE of NOR gate 710 is 1 (logic high). When the one of the inputs becomes active, output GE is driven low and the multiplexer is signaled to turn on through logic driver 750. The output of NOR gate 710 is coupled to the input of logic driver 750.

Logic driver 750 has two outputs: PU (pull up) and PD (pull down). The NAND gates 760, 765 in logic driver 750 operate as inverters where PD will be driven high and PU will be driven low if GE is high. If GE is low, the outputs will be driven in the opposite direction. For other embodiments, other circuit configurations may be used to generate opposite output signals PU and PD based on the value of GE.

The BLKSA <0:3> outputs, in sense amplifier enable logic 720, are generated using AND gates 722, 724, 726, and 728, having inputs SA (sense amplifier enable) and BLK <0:3>, respectively. The SA input is a delayed version of an equalization signal applied to the bit line loads where the voltage levels on bit lines BL and BLB are equalized prior to connecting them to a selected memory cell during a read cycle. This technique may prevent data corruption in the selected cell and may allow for faster bit line excursion. It should be noted that this technique is well known in the art and, thus, the details of the technique are not discussed herein.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An output circuit, comprising:
   a first circuit having:
      a first driver having a data input coupled to receive a first data, a control input coupled to receive a block control signal, and an output; and
      a second driver having a data input coupled to receive a global bus data, an inverted control input coupled to receive the block control signal, and an output, the output of the second driver coupled to the data input of the first driver, the data input of the second driver coupled to the output of the first driver, the control input of the first driver coupled to the inverted control input of the second driver; and
   a second circuit coupled to receive a second data, the block control signal, and the global bus data, wherein one of the first and second data is received and transferred in a first direction by one of the first and second circuits while the global bus data is, concurrently, received and transferred in a reverse direction by one of the first and second circuits.

2. The output circuit of claim 1, wherein the second driver tristates and the first driver is active if the block control signal is a first value, and wherein the first driver tristates and second driver is active if the block control signal is a second value.

3. The output circuit of claim 1, wherein the first and the second drivers are full-swing CMOS, half-swing CMOS, ECL, or TTL standard compatible.

4. The output circuit of claim 1, wherein the first and the second drivers are Bipolar, NMOS, PMOS, CMOS, or BiCMOS technology compatible.

5. The output circuit of claim 1, further comprising:
   a first local bus line having the first data;
   a second local bus line having the second data;
   a global bus having the global bus data; and
   the second circuit having:
      a third driver having a data input coupled to receive the second data, a control input coupled to receive the block control signal, and an output; and
      a fourth driver having a data input coupled to receive the global bus data, an inverted control input coupled to receive the block control signal, and an output, the output of the fourth driver coupled to the data input of the third driver, the data input of the fourth driver coupled to the output of the third driver, the control input of the third driver coupled to the inverted control input of the fourth driver.

6. The output circuit of claim 5, wherein the third and the fourth drivers are full-swing CMOS, half-swing CMOS, ECL, or TTL standard compatible.

7. The output circuit of claim 5, wherein the third and the fourth drivers are Bipolar, NMOS, PMOS, CMOS, or BiCMOS technology compatible.

8. The output circuit of claim 5, wherein the second and the third drivers tristate, the first driver outputs the first data onto the global bus line, and the fourth driver outputs the global bus data onto the second local bus line if the block control signal is a first value, and wherein the first and the fourth drivers tristate, the third driver outputs the second data onto the global bus line, and the second driver outputs the global bus data onto the first local bus line if the block control signal is a second value.

9. The output circuit of claim 8, further comprising:

a first sense amplifier coupled to the first local bus line, the first sense amplifier transmitting the first data to the first local bus line; and a second sense amplifier coupled to the second local bus line, the second sense amplifier to tristate if the block control signal is a first value.

10. A memory comprising the output circuit of claim 5, the memory comprising:

an array of memory cell storage devices;

a first sense amplifier having an output and an input coupled to a first memory cell storage device in the array, the output of the first sense amplifier coupled to the first local bus line;

a second sense amplifier having an output and an input coupled to a second memory cell storage device in the array, the output of the second sense amplifier coupled to the second local bus line; and a block control circuit to produce a block control signal.

11. The memory of claim 10, wherein the second sense amplifier tristates, the second and the third drivers tristate, the first driver outputs the local bus data onto the global bus line, and the fourth driver outputs the global bus data onto the local bus line if the block control signal is a first value, wherein the first amplifier tristates, the first and the fourth drivers tristate, the third driver outputs the local bus data onto the global bus line, and the second driver outputs the global bus data onto the local bus line.

12. A method of driving a data output path, comprising:

transmitting a first data on a first local bus line to a global bus if a first block control signal is a first value; and concurrently transmitting a global bus data to a second local bus line if a second block control signal is a second value.

13. The method of claim 12, wherein transmitting a first data comprises:

activating a first output driver, having an input coupled to the first local bus line and an output coupled to the global bus, based on the first block control signal value;

tristating a first feedback driver, having an input coupled to the global bus and an output coupled to the first local bus line, based on the first block control signal value.

14. The method of claim 12, wherein concurrently transmitting a global bus data comprises:

activating a second feedback driver, having an input coupled to the global bus and an output coupled to a second local bus line, based on the second block control signal value; and tristating a second output driver, having an input coupled to the second local bus line and an output coupled to the global bus, based on the second block control signal value.

15. The method of claim 13, further comprising:

activating a first sense amplifier having an output coupled to the first local bus line.

16. The method of claim 14, further comprising:

tristating a second sense amplifier having an output coupled to the second local bus line.

17. An output data path, comprising:

a feedforward portion configured to drive a data signal from a selected local bus line onto a global bus; and a feedback portion configured to drive the data signal from the global bus onto a deselected local bus line, wherein the feedforward portion and the feedback portion operate concurrently.

18. The output data path of claim 17, further comprising:

a first sense amplifier configured to drive the data signal onto the selected local bus line; and a second sense amplifier coupled to the deselected local bus line configured to tristate.

* * * * *